United States Patent
Toben et al.

(10) Patent No.: US 6,210,556 B1
(45) Date of Patent: Apr. 3, 2001

(54) ELECTROLYTE AND TIN-SILVER ELECTROPLATING PROCESS

(75) Inventors: Michael P. Toben, Smithtown; Daniel C. Marcktell, Flushing; Neil D. Brown, Merrick; Colleen A. Doyle, Holbrook, all of NY (US)

(73) Assignee: Learonal, Inc., Freeport, NY (US)

( * ) Notice: Subject to any disclaimer, the term of this patent is extended or adjusted under 35 U.S.C. 154(b) by 0 days.

(21) Appl. No.: 09/246,310

(22) Filed: Feb. 8, 1999

Related U.S. Application Data

(60) Provisional application No. 60/074,481, filed on Feb. 12, 1998.

(51) Int. Cl.$^7$ .................................................... C25D 3/60
(52) U.S. Cl. ........................ 205/253; 106/1.23; 106/1.25
(58) Field of Search ........................... 205/253; 106/1.23, 106/1.25

(56) References Cited

U.S. PATENT DOCUMENTS

| | | | |
|---|---|---|---|
| 5,118,394 | 6/1992 | Makino et al. | 205/253 |
| 5,514,261 | 5/1996 | Herkolotz et al. | 205/238 |
| 5,601,696 | 2/1997 | Asakawa | 205/263 |

FOREIGN PATENT DOCUMENTS

| | | |
|---|---|---|
| 4330068 | 3/1995 | (DE) . |
| 0 829 557 | 3/1998 | (EP) . |
| 409302476 | 11/1997 | (JP) . |
| 409302498 | 11/1997 | (JP) . |
| 9-302498 * | 11/1997 | (JP) . |
| 09302498 | 11/1997 | (JP) . |

OTHER PUBLICATIONS

Am. Elect. Sco. 69$^{th}$ Ann. Tech. Conf. Proceedings, vol. 2, 1982, W. Flühmann et al., "Properties and Application of Electrodeposited CU–Zn–SN Alloys". (no month available).

J. Electrochem. Soc. Elecrochemical Science and Technology, Apr. 1973, pp. 484–487, H. Leidheiser, Jr. et al., "Pulse Electroplating of Silver–Tin Alloys and the Formation of $Ag_3Sn$".

Plating and Surface Finishing, Jan. 1983, pp. 45–48, J. Cl. Puippe et al., "Electrodeposition and Properties of a Silver–Tin Alloy".

Plating and Surface Finishing, Feb. 1998, T. Kondo et al., pp. 51–55, "Bright Tin–Silver Alloy Electrodeposition from an Organic Sulfonate Bath Containing Pyrophosphate, Iodide & Triethanolamine as Chelating Agents".

Plating and Surface Finishing, Mar. 1984, N. Kubota et al., pp. 53–59, "Electrodeposition of Silver–Tin Alloys From Pyrophosphate Solution".

* cited by examiner

Primary Examiner—Kishor Mayekar
(74) Attorney, Agent, or Firm—Pennie & Edmonds LLP

(57) ABSTRACT

The invention relates to an electrolyte for depositing tin-rich tin-silver alloys upon a substrate. This electrolyte includes a basis solution containing a solution soluble tin and silver compounds; a tin chelating agent of a polyhydroxy compound in an amount sufficient to complex tin ions provided by the tin compound; and a silver chelating agent of a heterocyclic compound in an amount sufficient to complex silver ions provided by the silver compound. Preferably, the tin and silver compounds are present in relative amounts to enable deposits containing about 85 to 99% by weight tin and about 0.5 to 15% by weight silver to be obtained.

14 Claims, No Drawings

ELECTROLYTE AND TIN-SILVER ELECTROPLATING PROCESS

CROSS-REFERENCE TO RELATED APPLICATIONS

This application is a continuation-in-part of provisional application serial No. 60/074,481 filed Feb. 12, 1998.

BACKGROUND OF INVENTION

Tin-lead alloy electroplating processes have been in use for many years, and eutectic tin-lead is used extensively in applications requiring attachment of electronic components to printed circuit boards by soldering or reflowing. During assembly, sufficient heat is applied to melt the eutectic tin-lead deposit, and upon cooling, a metallurgical bond between the component and circuit board is formed.

The temperature at which the tin-lead alloy melts is very important. Eutectic tin-lead contains 63% tin and 37% lead, and melts at a temperature of 183° C. which is very well matched to the prevalent materials of construction in use today for circuit boards. At liquidus temperatures much higher than this, dimensional instability of the circuit board laminate may result. At liquidus temperatures much lower than this, the alloy may melt prematurely during prior thermal operations of the assembly process.

The electronics industry are continuously looking for alternatives to lead, as the toxic properties of this material are well known and future use may become restricted. The challenge to the industry has been finding suitable replacements for tin-lead alloy solders that possess the same or similar properties. Once found, the challenge to the electrochemist is to develop an electroplating process capable of codepositing the alloying metals in just the right proportion to impart the necessary properties to the electrodeposit.

Solid alloys of eutectic tin-silver have been used as effective solders for years, most notably in the plumbing industry where the use of lead containing solders has been prohibited because of the potential for lead leaching into the drinking water supply. Eutectic tin-silver contains 96.5% tin and 3.5% silver, and becomes liquidus at a temperature of 221° C., however, as the silver content of the alloy increases slightly, the liquidus temperature increases dramatically. One hundred percent tin melts at 232° C. Increasing the silver content to 10% raises the liquidus temperature to 300° C., a temperature which is too high for common printed circuit board materials to withstand. Applying a temperature of less than 300° C. to a tin-silver alloy containing 10% silver would not provide sufficient heat to fully melt the alloy, resulting in incomplete and inadequate formation of the solder joint. In attempting to electroplate eutectic tin-silver alloys, critical control of the silver content of the deposit is therefore essential.

W. Flühmann, et. al., "PROPERTIES AND APPLICATION OF ELECTRODEPOSITED CU-Zn-SN ALLOYS, Am. Elect. Soc. 69$^{th}$ Ann. Tech. Conf. Proceedings, Vol. 2, 1982, describes a silver-tin deposit containing 90% silver and 10% tin produced from a pyrophosphate electrolyte for decorative applications, claiming a reduction in the tendency for silver to tarnish when alloyed with small amounts of tin. The wear resistance of such alloys is reportedly improved. H. Leidheiser, Jr., et. al., PULSE ELECTROPLATING OF SILVER-TIN ALLOYS AND THE FORMATION OF $Ag_3Sn$, J. Electrochem Soc., April 1973, pp. 484–487 describes a silver-tin electrolyte using tin stannate in place of pyrophosphate with pulsed current to improve the deposit quality. A number of other references disclose electrolytes for silver-tin alloys, including U.S. Pat. No. 5,514,261 and DE patent application 4,330,068. Here silver is the primary ingredient and the tin is present in much smaller amounts.

The electrodeposition of tin rich alloys of tin-silver is difficult given the large difference in reduction potential between the two metals. Furthermore, the preferential reduction of tin is made more difficult by the fact that silver exists in solution as a monovalent ion, whereas tin is either divalent or tetravalent and thereby requires two or four times the amount of current for reduction to occur relative to silver. In addition, an appreciable amount of silver should be present in solution to allow for the practical operation of the electrolyte on a production scale.

SUMMARY OF INVENTION

The invention relates to an electrolyte for depositing tin-rich alloys of tin-silver upon a substrate. This electrolyte comprises a basis solution containing a solution soluble tin compound and a solution soluble silver compound; a tin chelating agent of a polyhydroxy compound in an amount sufficient to complex tin ions; and a silver chelating agent of a heterocyclic compound in an amount sufficient to complex silver ions. Generally, the tin compound is a tin salt, the silver compound is a silver salt and the salts are present in relative amounts to enable deposits containing 85 to 99% by weight tin and 0.5 to 15% by weight silver to be obtained. To achieve this deposit, the tin concentration is typically about 20 to 60 g/l and the silver concentration is typically about 4 to 8 g/l.

The tin chelating agent is an alcohol or an alkali metal or ammonium salt of an acid. The agent has the general formula $$R\text{—}(CHOH)_x\text{—}R$$

where each R is the same or different and each is —H, —$(CH_2)_y$—OZ, —$(CH_2)_y$—C(O)OZ, —$(CH_2)_y$—CHO, or —$(CH_2)_y$—$CH_3$ where x is 1 to 6, y is 0 to 4 and Z is —H, —$NH_4$ or an alkali or alkaline earth metal. Preferably, the tin chelating agent is a polyhydric alcohol, an aldonic or aldaric acid, or a salt of those acids, and is present in an amount between about 10 and 500 g/l.

The silver chelating agent is a heterocyclic ring compound containing 3 to 7 carbon atoms and 1 to 3 nitrogen atoms in the ring. Preferably, the silver chelating agent is an imide and is present in an amount of between about 5 and 150 g/l.

The electrolyte generally has a pH of about 6 to 11 and a temperature of about 75 to 160° F. during use. Also, a grain refining agent, such as an alkoxylate or gelatin, can be included in an amount sufficient to enhance the properties of the resulting deposit.

The invention also relates to a method for depositing a tin-rich tin-silver deposit on a substrate which comprises contacting the substrate with the electrolyte described above and passing a current through the electrolyte to deposit the desired alloy on the substrate.

DETAILED DESCRIPTION OF THE INVENTION

The present electrolyte is used for depositing tin rich tin-silver alloys upon a substrate. By "tin-rich" what is meant is more than 50% and preferably more than 80% by weight tin relative to the amount of silver in the resulting deposit.

The electrolyte comprises a basis solution containing a solution soluble tin compound, a solution soluble silver compound, a chelating or complexing agent for tin and a chelating or complexing agent for silver. Preferably, the electrolyte produces tin-silver deposits containing 0.5 to 15% by weight silver, more preferably 2 to 5% by weight silver and most preferably 3 to 5% by weight silver.

Any solution soluble tin compound can be used, with salts of halides or acids being typical. Preferred tin compounds include salts such as tin sulfate, tin chloride and tin methane sulfonate.

Any solution soluble silver compound can be used, with salts of halides or acids being typical. Preferred silver compounds include salts such as silver nitrate and silver methane sulfonate.

The tin concentration of the electrolyte typically varies from about 20 to 60 g/l, and preferably from about 30 to 55 g/l. The silver concentration of the electrolyte typically varies from about 3 to 9 g/l, and preferably about 4 to 8 g/l.

Suitable chelating agents for tin ions include polyhydroxy compounds such as polyhydroxy alcohols, polyhydric acids or the alkali or ammonium salts of those acids. Preferred chelating agents have the general formula:

R—(CHOH)$_x$—R where each R is the same or different and each is —H, —(CH$_2$)$_y$—OZ, —(CH$_2$)$_y$—C(O)OZ, —(CH$_2$)$_y$—CHO, or —(CH$_2$)$_y$—CH$_3$ where x is 1 to 6, y is 0 to 4 and Z is —H, —NH$_4$ or an alkali or alkaline earth metal. Advantageously, these agents have at least four carbon atoms and at least two hydroxy groups. Preferred agents include polyhydric alcohols such as threitol, xylitol, and sorbitol; aldonic acid salts such as gluconates, glucoheptonates, xylonates, and threonates; aldaric acids salts such as galacarates, glucurate and tartrates; and uronic acids such as glucuronic acid. Any ammonium, alkali metal or alkaline earth metal salt of these acids can be used.

Suitable chelating agents for silver ions include nitrogen containing saturated or unsaturated heterocyclic ring compounds containing 3 to 7 carbons atoms and 1 to 3 nitrogen atoms in the ring. One formula of a 5 membered heterocyclic ring containing 4 carbon atoms and 1 nitrogen atom in the ring is shown below as a representative example of such structures:

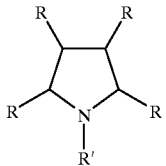

where each R is the same or different and is —H, —NH, —NH$_2$, —(CH$_2$)$_y$—CO, —(CH$_2$)$_y$—C(O)OZ, or —(CH$_2$)$_y$—CH$_3$, y is 0 to 5 and preferably 0 or 1, and Z is —H, —NH$_4$ or an alkali or alkaline earth metal and R' is —H, —(CH$_2$)$_y$—CO, —(CH$_2$)$_y$—C(O)OZ, or —(CH$_2$)$_y$—CH$_3$, y is 0 to 5 and preferably 0 or 1, and Z is —H, —NH$_4$ or an alkali or alkaline earth metal. Preferred compounds include imides, such as hydantoin, methylhydantoin, dimethylhydantoin, succinimide, pyrrolidone, pyrrolidone carboxylic acid, orotic acid, velarolactam, thymine, thymine acetic acid and caprolactam.

The amount of tin and silver chelating agents to be used can easily be determined by one of ordinary skill in the art by conducting routine tests. The amounts used should be those which will complex the tin and silver ions in the basis solution. For use of the preferred amounts of tin and silver disclosed above, the preferred amount of tin chelating agent would be about 100 to 400 g/l while the preferred amount of silver chelating agent would be about 50 to 100 g/l.

Grain refiners can be added to the electrolyte to improve deposit appearance and operating current density range. Preferred grain refining additives include alkoxylates, such as the polyethoxylated amines Jeffamine T-403 or Triton RW, or sulfated alkyl ethoxylates such as Triton QS-15, and gelatin or gelatin derivatives.

The pH of the electrolyte ranges from about 6 to 11, preferably from 7 to 9.5 and most preferably from 7–8. The pH can be adjusted by the addition of a base or an acid in a manner which is well known in the art. The operating temperature ranges from about 75 to 160° F., preferably from 90 to 140° F. and most preferably from 100 to 120° F.

Other alloying elements can be present in the deposit. Generally, small amounts of Copper, Zinc, Bismuth, Indium, or Antimony can be present to modify slightly the melting range of the tin-silver alloy. These elements, if present in the deposit, would be in an amount of less than 1% and typically less than 0.5%.

EXAMPLES

The following examples illustrate preferred formulations according to the invention. All percentages are by weight unless otherwise noted. In each example, aqueous solutions were used.

Example 1
The following electrolyte was prepared:

| | |
|---|---|
| Stannous Sulfate | 100 g/L (55 g/L Sn) |
| Silver Nitrate | 11 g/L (7 g/L Ag) |
| Sodium Gluconate | 220 g/L |
| Dimethylhydantoin | 60 g/L |
| Jeffamine T-403 | 0.4 g/L |
| pH | 9 (adding Potassium Hydroxide) |
| Temperature | 120° F. |
| Anodes | Pure tin |

Deposits plated from the above formulation were satin to matte in appearance and had a smooth grain structure with no dendritic growth. The relation between current density and deposit composition is shown below.

| Current Density, A/ft$^2$ | % Silver in Deposit |
|---|---|
| 5 | 0.2 |
| 10 | 0.6 |
| 20 | 2.1 |

Example 2
The following electrolyte was prepared:

| | |
|---|---|
| Stannous Chloride Dihydrate | 57 g/L (30 g/L Sn) |
| Silver Nitrate | 6.3 g/L (4 g/L Ag) |
| Sodium Gluconate | 120 g/L |
| Succinimide | 50 g/L |
| Jeffamine T-403 | 0.4 g/L |
| Triton QS-15 | 0.1 g/L |

-continued

| | |
|---|---|
| pH | 7.2 (adding Potassium Hydroxide) |
| Temperature | 120° F. |
| Anodes | Pure tin |

Deposits plated from the above formulation were satin to matte in appearance and had a smooth grain structure with no dendritic growth. The relation between current density and deposit composition is shown below.

| Current Density, A/ft$^2$ | % Silver in Deposit |
|---|---|
| 5 | 0.2 |
| 10 | 0.4 |
| 20 | 1.4 |

Example 3

The following electrolyte was prepared:

| | |
|---|---|
| Stannous Chloride Dihydrate | 104 g/L (40 g/L Sn) |
| Silver Dimethylhydantoin | 21 g/L (6.25 g/L Ag) |
| Sodium Tartrate | 175 g/L |
| Dimethylhydantoin (total) | 60 g/L |
| Gelatin | 0.1 g/L |
| pH | 8 (adding Sodium Hydroxide) |
| Temperature | 120° F. |
| Anodes | Pure tin |

Deposits plated from the above formulation were satin to matte in appearance and had a smooth grain structures with no dendritic growth. The relation between current density and deposition composition is shown below.

| Current Density, A/ft$^2$ | % Silver in Deposit |
|---|---|
| 5 | 0.2 |
| 10 | 1.4 |
| 20 | 1.9 |

Example 4

The following electrolyte was prepared:

| | |
|---|---|
| Stannous Methane Sulfonate | 104 g/L (40 g/L Sn) |
| Silver Methane Sulfonate | 11.7 g/L (6.25 g/L Ag) |
| Sodium Gluconate | 175 g/L |
| Imidazole | 60 g/L |
| Jeffamine T-403 | 0.4 g/L |
| Triton QS-15 | 0.1 g/L |
| pH | 8 (adding Ammonium Hydroxide) |
| Temperature | 120° F. |
| Anodes | Pure tin |

Deposits plated from the above formulation were satin to matte in appearance and had a smooth grain structure with no dendritic growth. The relation between current density and deposition composition is shown below.

| Current Density, A/ft$^2$ | % Silver in Deposit |
|---|---|
| 5 | 3.2 |
| 10 | 4.7 |
| 20 | 5.8 |

Example 5

The following electrolyte was prepared:

| | |
|---|---|
| Stannous Chloride Dihydrate | 75.5 g/L (40 g/L Sn) |
| Silver Nitrate | 9.8 g/L (6.25 g/L Ag) |
| Xylitol | 400 g/L |
| Hydantoin | 60 g/L |
| Jeffamine T-403 | 0.4 g/L |
| Triton QS-15 | 0.1 g/L |
| pH | 10.2 (adding Potassium Hydroxide) |
| Temperature | 120° F. |
| Anodes | Pure tin |

Deposits plated from the above formulation were satin to matte in appearance and had dendritic growth. The relation between current density and deposition composition is shown below.

| Current Density, A/ft$^2$ | % Silver in Deposit |
|---|---|
| 5 | 0.2 |
| 10 | 0.3 |
| 20 | 0.2 |

Example 6

The following electrolyte was prepared:

| | |
|---|---|
| Stannous Chloride Dihydrate | 75.5 g/L (40 g/L Sn) |
| Silver Nitrate | 9.8 g/L (6.25 g/L Ag) |
| Sodium Gluconate | 175 g/L |
| Dimethylhydantoin | 60 g/L |
| pH | 8 (adding Sodium Hydroxide) |
| Temperature | 120° F. |
| Anodes | Pure tin |

Deposits plated from the above formulation were matte in appearance and had rough, burned edges. The relation between current density and deposition composition is shown below.

| Current Density, A/ft$^2$ | % Silver in Deposit |
|---|---|
| 5 | 0.4 |
| 10 | 1.6 |
| 20 | 4.8 |

Example 7
The following electrolyte was prepared:

| | |
|---|---|
| Stannous Chloride Dihydrate | 75.5 g/L (40 g/L Sn) |
| Silver Nitrate | 11 g/L (7 g/L Ag) |
| Sodium Threonate | 175 g/L |
| Dimethylhydantoin | 60 g/L |
| Jeffamine T-403 | 0.4 g/L |
| Triton QS-15 | 0.1 g/L |
| pH | 8 (adding Potassium Hydroxide) |
| Temperature | 120° F. |
| Anodes | Pure tin |

Deposits plated from the above formulation were satin to matte in appearance and had a smooth grain structure with no dendritic growth. The relation between current density and deposition composition is shown below.

| Current Density, A/ft$^2$ | % Silver in Deposit |
|---|---|
| 5 | 2.7 |
| 10 | 5.3 |
| 20 | 5.3 |
| 40 | 4.4 |

Example 8
The following electrolyte was prepared:

| | |
|---|---|
| Stannous Chloride Dihydrate | 75.5 g/L (40 g/L Sn) |
| Silver Nitrate | 11 g/L (7 g/L Ag) |
| Sodium Gluconate | 175 g/L |
| Dimethylhydantoin | 60 g/L |
| Jeffamine T-403 | 0.4 g/L |
| Triton QS-15 | 0.1 g/L |
| pH | 8 (adding Potassium Hydroxide) |
| Temperature | 120° F. |
| Anodes | Pure tin |

Deposits plated from the above formulation were satin to matte in appearance and had a smooth grain structure with no dendritic growth. The relation between current density and deposition composition is shown below.

| Current Density, A/ft$^2$ | % Silver in Deposit |
|---|---|
| 5 | 9.6 |
| 10 | 6.3 |
| 20 | 4.4 |
| 40 | 1.5 |

Example 9
The following electrolyte was prepared:

| | |
|---|---|
| Stannous Chloride Dihydrate | 75.5 g/L (40 g/L Sn) |
| Silver Nitrate | 6.3 g/L (4 g/L Ag) |
| Sodium Gluconate | 175 g/L |
| Dimethylhydantoin | 60 g/L |
| Jeffamine T-403 | 0.4 g/L |
| Triton QS-15 | 0.1 g/L |
| pH | 8 (adding Potassium Hydroxide) |
| Temperature | 120° F. |
| Anodes | Pure tin |

Deposits plated from the above formulation were satin to matte in appearance and had a smooth grain structure with no dendritic growth. The relation between current density and desposition is shown below.

| Current Density, A/ft$^2$ | % Silver in Deposit |
|---|---|
| 5 | 0.2 |
| 10 | 1.1 |
| 20 | 2.3 |
| 40 | 3.1 |

Example 10
The following electrolyte was prepared:

| | |
|---|---|
| Stannous Chloride Dihydrate | 75.5 g/L (40 g/L Sn) |
| Silver Nitrate | 8.7 g/L (7 g/L Ag) |
| Sodium Gluconate | 175 g/L |
| Dimethylhydantoin | 60 g/L |
| Jeffamine T-403 | 0.4 g/L |
| Triton QS-15 | 0.1 g/L |
| pH | 8 (adding Potassium Hydroxide) |
| Temperature | 140° F. |
| Anodes | Pure tin |

Deposits plated from the above formulation were satin to matte in appearance and had a smooth grain structure with no dendritic growth. The relation between current density and deposition composition is shown below.

| Current Density, A/ft$^2$ | % Silver in Deposit |
|---|---|
| 5 | 0.2 |
| 10 | 0.9 |
| 20 | 1.8 |
| 40 | 1.3 |

Example 11
The following electrolyte was prepared:

| | |
|---|---|
| Stannous Chloride Dihydrate | 75.5 g/L (40 g/L Sn) |
| Silver Nitrate | 9.8 g/L (6.25 g/L Ag) |
| Sodium Gluconate | 175 g/L |
| Dimethylhydantoin | 60 g/L |
| Jeffamine T-403 | 0.4 g/L |
| Triton QS-15 | 0.1 g/L |
| pH | 8 (adding Sodium Hydroxide) |
| Temperature | 120° F. |
| Anodes | Pure tin |

Deposits plated from the above formulation were satin to matte in appearance and had a smooth grain structure with no dendritic growth. The relation between current density and deposition composition is shown below.

| Current Density, A/ft² | % Silver in Deposit |
|---|---|
| 5 | 0.8 |
| 10 | 3.2 |
| 20 | 3.2 |
| 40 | 3.0 |

For convenience, these examples illustrate only tin and silver deposits, but it is to be understood that small amounts of alloying elements that do not detrimentally affect the meting temperature and properties of the resultant deposit can be included. These elements can be added to the basis solution in the form of solution soluble compounds, as is well known in the art. The previous disclosure also teaches various modifications and variations to persons of ordinary skill in the art and is in intended that the following claims encompass all such modifications.

What is claimed is:

1. An electrolyte for depositing a tin-rich tin-silver alloy upon a substrate, comprising a basis solution containing:
    a solution soluble tin compound and a solution soluble silver compound, wherein the tin compound is present in an amount which is greater than that of the silver compound to provide a deposit that contains about 85 to 99% by weight tin and about 0.5 to 15% by weight silver;
    a tin chelating agent of a polyhydroxy compound in an amount sufficient to complex tin ions provided by the tin compound; and
    a silver chelating agent of a heterocyclic compound in an amount sufficient to complex silver ions provided from the silver compound;
    wherein the silver chelating agent is a compound having the formula:

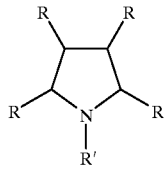

wherein each R is the same or different and is —H, —NH, —NH$_2$,(CH$_2$)$_y$—CO, —(CH$_2$)$_y$—C(O)OZ, or —(CH$_2$)$_y$—CH$_3$, y is 0 to 5 and Z is —H, —NH$_4$ or an alkali or alkaline earth metal and R' is —H, —(CH$_2$)$_y$—CO, —(CH$_2$)$_y$—C(O)OZ, or —(CH$_2$)$_y$—CH$_3$, y is 0 to 5 and Z is —H, —NH$_4$ or an alkali or alkaline earth metal.

2. The electrolyte of claim 1 wherein the tin compound is a tin salt, the silver compound is a silver salt and the salts are present in relative amounts to obtain deposits containing at least about 80% by weight tin relative to the weight of tin and silver.

3. The electrolyte of claim 2 wherein the concentration of the solution soluble tin compound is about 20 to 60 g/l and the concentration of the solution soluble silver compound is about 4 to 8 g/l.

4. The electrolyte of claim 1 wherein the polyhydroxy compound is an alcohol or an alkali metal or ammonium salt of an acid, said agent having the formula:

where each R is the same or different and each is —H, —(CH$_2$)$_y$—OZ, —(CH$_2$)$_y$—C(O)OZ, —(CH$_2$)$_y$—CHO, or —(CH$_2$)$_y$—CH$_3$ where x is 1 to 6, y is 0 to 4 and Z is —H, —NH$_4$ or an alkali or alkaline earth metal.

5. The electrolyte of claim 1 wherein the tin chelating agent is a polyhydric alcohol, an aldonic or aldaric acid, or a salt of those acids.

6. The electrolyte of claim 1 wherein the tin chelating agent has at least four carbon atoms and at least two hydroxy groups and is present in an amount of between about 10 and 500 g/l.

7. The electrolyte of claim 1 wherein the silver chelating agent is a saturated or unsaturated heterocyclic ring compound containing 3 to 7 carbon atoms and 1 to 3 nitrogen atoms in the ring.

8. The electrolyte of claim 1 wherein the silver chelating agent is an imide.

9. The electrolyte of claim 1 wherein the silver chelating agent is hydantoin, methyl hydantoin; dimethyl hydantoin, succinimide, pyrrolidone, pyrrolidone carboxylic acid, orotic acid, velarolactam, thymine, thymine acetic acid or caprolactam.

10. The electrolyte of claim 1 wherein the silver chelating agent is present in an amount of between about 5 and 150 g/l.

11. The electrolyte of claim 1 having a pH of about 6 to 11 and a temperature of about 75 to 160° F.

12. The electrolyte of claim 1 further comprising a grain refining agent in an amount sufficient to enhance the properties of the resulting deposit.

13. The electrolyte of claim 1 wherein the grain refining agent is an alkoxylate or gelatin.

14. A method for depositing a tin-rich tin-silver deposit on a substrate which comprises contacting the substrate with the electrolyte of claim 1 and passing a current through the electrolyte to deposit the desired tin-silver alloy on the substrate.

* * * * *